United States Patent [19]

Itano

[11] Patent Number: 5,353,249
[45] Date of Patent: Oct. 4, 1994

[54] NON-VOLATILE SEMICONDUCTOR MEMORY DEVICE

[75] Inventor: Kiyoshi Itano, Kawasaki, Japan

[73] Assignee: Fujitsu Limited, Kawasaki, Japan

[21] Appl. No.: 10,434

[22] Filed: Jan. 28, 1993

[30] Foreign Application Priority Data

Jan. 30, 1992 [JP] Japan .................................. 4-015516

[51] Int. Cl.[5] .......................... G11C 7/00; G11C 11/40
[52] U.S. Cl. ................................ 365/185; 365/189.09;
365/205; 365/208; 365/233.5
[58] Field of Search ................... 365/189.09, 205, 208,
365/175, 185, 233.5; 307/530

[56] References Cited

U.S. PATENT DOCUMENTS 4,698,789 10/1987 Iizuka ................................. 365/226
5,018,107 5/1991 Yoshida ........................... 365/230.06

Primary Examiner—Do Hyun Yoo
Attorney, Agent, or Firm—Nikaido, Marmelstein, Murray & Oram

[57] ABSTRACT

A non-volatile semiconductor device includes a bus line; a plurality of bit lines coupled to the bus line; a cell transistor, connected between each of the bit lines and a word line, for storing electrical information; an output circuit, coupled to the bus line, for outputting a signal corresponding to the electrical information stored in the cell transistor under a condition in which the bus line has been charged to a predetermined voltage level; a constant voltage circuit coupled to the bus line, the constant voltage circuit generating a voltage having an approximately constant level when a current flows through the constant voltage circuit; and a current supply circuit, coupled to the bus line, for supplying a current to the constant voltage circuit via the bus line in accordance with a control signal supplied from an external unit, whereby the bus line is charged to a predetermined voltage level by the voltage generated by the constant voltage circuit.

16 Claims, 7 Drawing Sheets

FIG. I PRIOR ART

NON-VOLATILE SEMICONDUCTOR MEMORY DEVICE

BACKGROUND OF THE INVENTION (1) Field of the Invention

The present invention relates to a non-volatile semiconductor memory device, such as an EPROM (Erasable and Programmable Read Only Memory) and an EEPROM (Electrically Erasable and Programmable Read Only Memory), which memory device is provided with non-volatile memory cell transistors.

If the cost of a non-volatile semiconductor memory device can be reduced, the non-volatile semiconductor memory device can be substituted for a floppy disk unit, a hard disk unit and the like and used as an auxiliary memory unit for a computer system. The non-volatile semiconductor memory device having a large capacity can be made using a fine patterning process, so that the cost of the non-volatile semiconductor memory device can be reduced. In addition, the processing speed of CPUs (central processing units) in computer systems is gradually increasing. Thus, a high-speed non-volatile semiconductor memory is desired.

(2) Description of the Related Art

FIG. 1 shows an essential part of a conventional EPROM which is one of the types of non-volatile semiconductor memory- Referring to FIG. 1, a cell-transistor 1 is connected between a word line 2 and a bit line 3. The bit line 3 is connected to a bus line 6 via a bit selecting transistor 4 (an n-MOS transistor). A word line selecting signal X is supplied to the gate of the cell-transistor 1 via the word line 2. A bit line selecting signal Y is supplied to the gate of the bit selecting transistor 4. Actually, a plurality of bit lines are connected to the bus line 6 via bit selecting transistors and a plurality of cell-transistors form a memory cell in the EPROM. For the sake of simplicity, FIG. 1 shows only the single cell-transistor 1 and the single bit line 3 connected with the cell-transistor 1.

The bus line 6 is included in a sense amplifier 5. In the sense amplifier 5, a resistor 11 is connected between a power line 7 (Vcc:e.g. +5V) and the drain of a transistor 9 (an n-MOS transistor). The gate and source of the transistor 9 are respectively connected to the bus line 6 and a ground line. A load transistor 13 (a p-MOS transistor) is connected between a power line 8 (Vcc:e.g. +5V) and the drain of a transistor 10 (an n-MOS transistor). The source of the transistor 10 is connected to the bus line. 6. A resistor 12 is connected between the bus line 6 and the ground line. Both the drain and the gate of the load transistor 13 are connected to an output terminal 14.

Data "1" stored in the cell-transistor 1 is read out as follows. When the bit line selecting signal Y and the word line selecting signal X are activated, a current flows through the cell-transistor 1. In this case, the voltage of the bus line 6 decreases and the on-resistance of the transistor 9 increases, so that the voltage level at a node 15 connected to the gate of the transistor 10 increases. Thus, the transistor 10 is turned on and a current flows through the load transistor 13. As a result, the level of the output voltage Vout at the output terminal 14 decreases. That is, the output voltage Vout has a low level corresponding to the data "1".

Data "0" stored in the cell-transistor 1 is read out as follows. When the bit line selecting signal Y and the word line selecting signal X are activated, no current flows through the cell-transistor 1. In this case, the voltage level of the bus line 6 is maintained at a high level, so that the transistor 10 is maintained in an off-state. Thus, the output voltage Vout at the output terminal 14 has a high level corresponding to the data "0" and is maintained in this state.

In a case where the data stored in the cell-transistor 1 is read out, the bus line 6 must have been charged to a predetermined voltage level. However, if the above read operation of the cell-transistor 1 is performed under a condition in which the voltage level of the bus line 6 is greater than 1.5 [V], a situation occurs in which electrons are injected into the cell-transistor 1. In this case, the data stored in the cell-transistor 1 is corrupted. This corruption of data stored in the cell-transistor 1 is often referred to as a soft error. In the conventional EPROM shown in FIG. 1, the bus line 6 is charged by the load transistor 13 and the voltage of the bus line 6 is maintained at a 1 [V] level by operations of the transistors 9 and 10. That is, circuit constants of the EPROM are set so that, when the level of the bus line 6 exceeds 1 [V], the voltage level at the node 15 decreases and the transistor 10 is turned off. As a result, the voltage level of the bus line 6 is maintained at 1 [V].

However, when the voltage level of the bus line 6 nears 1v, the transistor 10 nears the off state so that the amount of current flowing through the transistor 10 decreases. As a result, it takes a long time to charge the bus line 6 until the voltage level thereof reaches 1 [V], as shown in FIG. 2. Thus, either when the state of the EPROM changes from a stand-by state where no voltage is applied to the bit line 3 to an active state where the voltage is applied to the bit line 3, or when address signals (including the bit line selecting signal Y and the word line selecting signal X) are switched to the active state, it is difficult to rapidly charge the bus line 6 to a predetermined voltage level (e.g. 1 [V]). That is, it is difficult to obtain high-speed operation of the EPROM.

SUMMARY OF THE INVENTION

Accordingly, a general object of the present invention is to provide a novel and useful non-volatile semiconductor memory device in which the disadvantages of the aforementioned prior art are eliminated.

A more specific object of the present invention is to provide a non-volatile semiconductor memory device in which the bus line coupled to a plurality of bit lines can be rapidly charged to a predetermined voltage level.

The above objects of the present invention are achieved by a non-volatile semiconductor memory device comprising: a bus line; a plurality of bit lines coupled to the bus line; a cell transistor, connected between each of the bit lines and a word line, for storing electrical information; an output circuit, coupled to the bus line, for outputting a signal corresponding to the electrical information stored in the cell transistor under a condition in which the bus line has been charged to a predetermined voltage level; a constant voltage circuit coupled to the bus line, the constant voltage circuit generating a voltage having an approximately constant level when a current flows through the constant voltage circuit; and a current supply circuit, coupled to the bus line, for supplying a current to the constant voltage circuit via the bus line in accordance with a control signal supplied from an external unit, whereby the bus line is charged to a predetermined voltage level by the voltage generated by the constant voltage circuit.

According to the present invention, the constant voltage circuit generating the voltage having an approximately constant level when the current flows through the constant voltage circuit is coupled to the bus line. Thus, the bus line can be rapidly charged to a predetermined voltage level by the voltage generated by the constant voltage circuit.

Additional objects, features and advantages of the present invention will become apparent from the following detailed description when read in conjunction with the accompanying drawings.

DESCRIPTION OF THE PREFERRED EMBODIMENTS

A description will now be given, with reference to FIGS. 3 through 5, of a first embodiment of the present invention.

Figure 3:
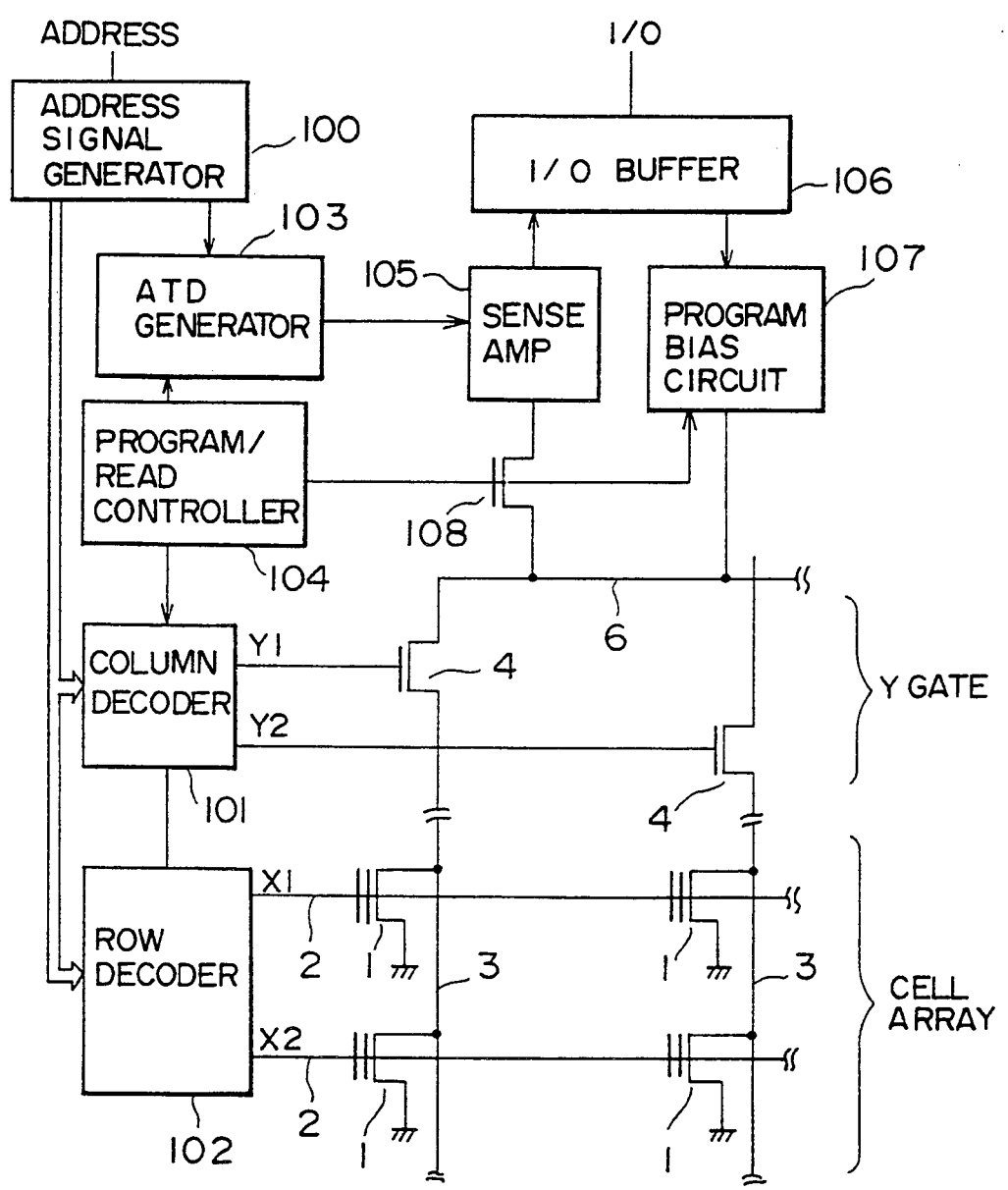
FIG. 3 is a block diagram illustrating the whole structure of an EPROM according the present invention.

The whole structure of an EPROM is shown, for example, in FIG. 3. In FIG. 3, an address signal generator 100 generates an address signal based on address data supplied from an external system (e.g. a computer system). A column decoder 101 generates the bit line selecting signals Y1 and Y2 based on the address signal. A row decoder 102 generates the word line selecting signals X1 and X2 based on the address signal supplied from the address signal generator 100. The bit line selecting signals Y1 and Y2 are respectively supplied to the bit selecting transistors 4 connected between the bus line 6 and respective bit lines 3. The word line selecting signals X1 and X2 are respectively supplied to the cell-transistors 1 via the word lines 2, which cell-transistors 1 are connected to the bit lines. The address signal generator 100 supplies a control signal to an ATD generator 103. A program/read controller 104 supplies program/read control signals to the ATD generator 103, the column decoder 101 and the row decoder 102. The ATD generator 103 generates an ATD (address transition detector) signal. The ATD signal remains active for a predetermined time from either a time at which the state of the EPROM transfers from the stand-by state to the active state (a chip-enable signal is activated), or the time at which the address signal is changed in the active state. A sense amplifier 105 is connected to the bus line 6 via a transistor 108 to which a control signal is supplied from the program/read controller 104. The sense amplifier 105 inputs the ATD signal from the ATD generator 103. The sense amplifier 105 reads out data from a selected cell-transistor 1 and supplies it to the computer system via an I/O buffer 106. A program bias circuit 107 is connected to the bus line 6. In the program mode, the program bias circuit 107 inputs a control signal from the program/read controller 104, and program data is supplied from the computer system to the program bias circuit 107 via the I/O buffer 106. The program bias circuit 107 then applies a program voltage to the bus line 6 in accordance with the program data so that the program data is written in a selected cell-transistor 1.

An essential part of the EPROM shown in FIG. 3 will be described below with reference to FIG. 4. For the sake of simplicity, FIG. 4 shows only one bit line 3 to which only one cell-transistor 1 is connected. In FIG. 4, those parts which are the same as those shown in FIG. 1 are given the same reference numbers.

Figure 4:
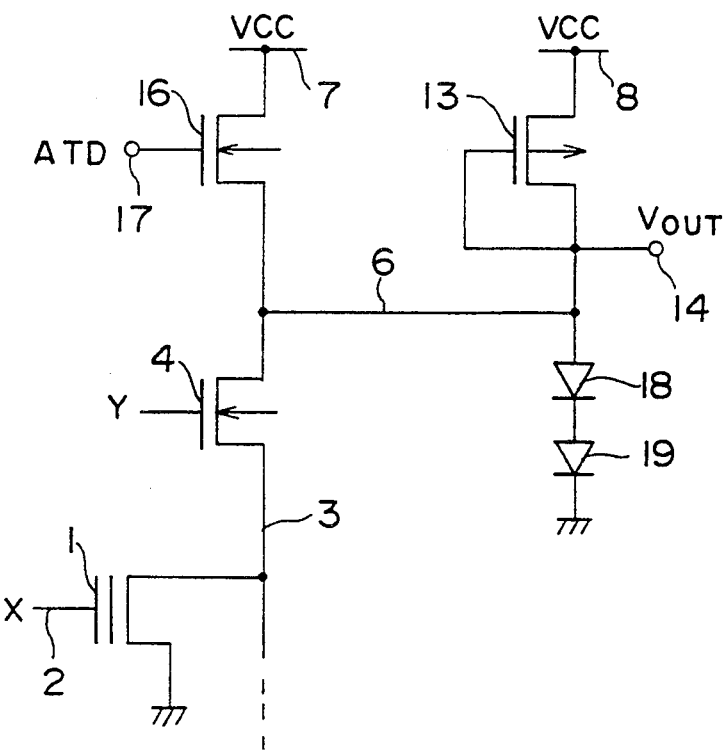
FIG. 4 is a circuit diagram illustrating an essential part of the EPROM according to a first embodiment of the present invention.

Referring to FIG. 4, the sense amplifier is provided with a transistor 16 (an n-MOS transistor) and the load transistor 13 (a p-MOS transistor). The drain of the transistor 16 is connected to the power line 7, and the source thereof is connected to the bus line 6. The gate of the transistor 16 is connected to an ATD terminal 17 to which the ATD signal is supplied from the ATD generator 103 shown in FIG. 3. The source of the transistor 13 is connected to the power line 8, and both the gate and the drain of the transistor 13 are connected to the bus line 6, in the same manner as those of the transistor 13 shown in FIG. 1. Two diodes 18 and 19 are serially connected between the bus line 6 and the ground line so that a current can flow from the bus line 6 to the ground line through the diodes 18 and 19.

Figure 1:
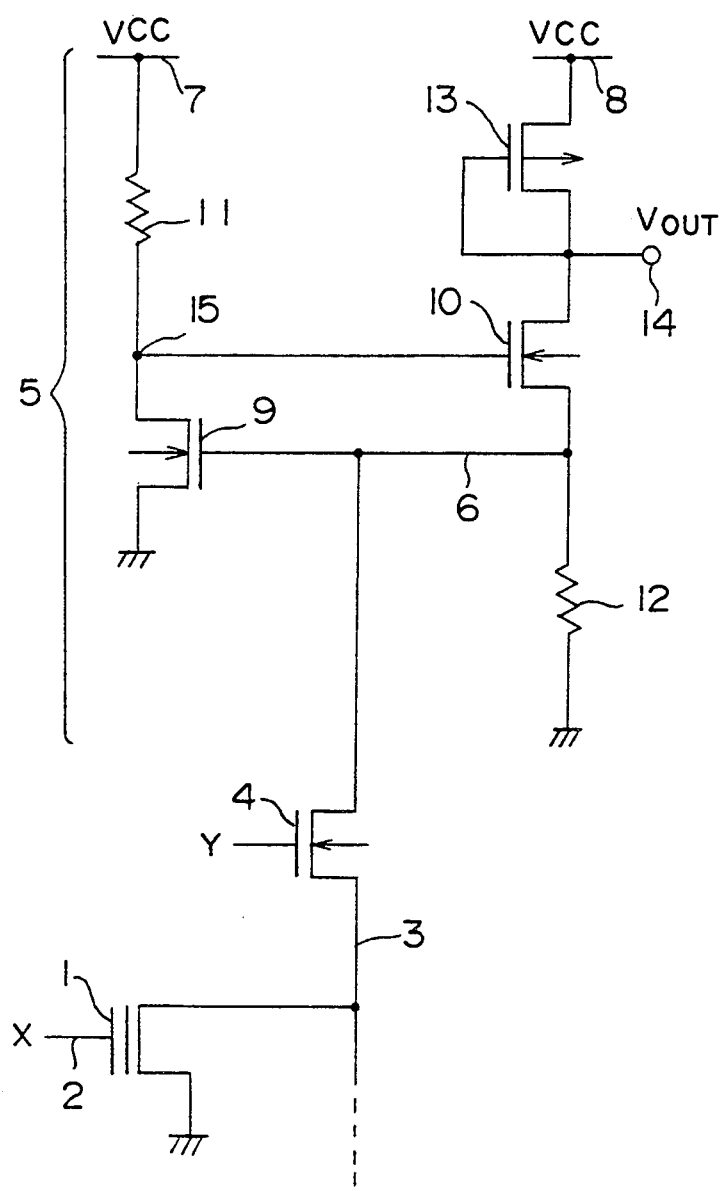
FIG. 1 is a circuit diagram illustrating an essential part of a conventional EPROM.
Figure 2:
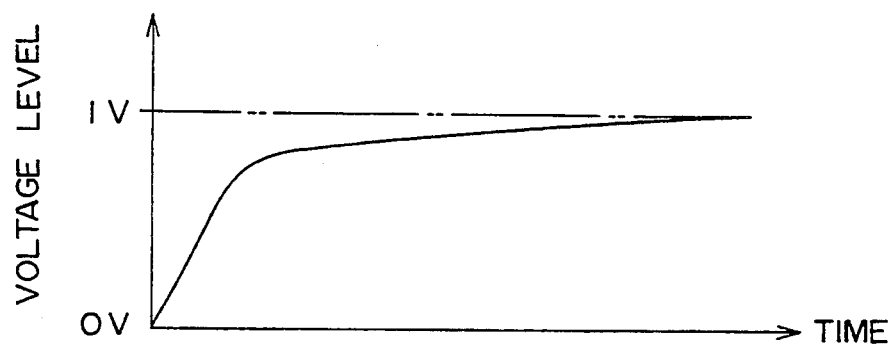
FIG. 2 is a graph illustrating a characteristic by which a bus line in the conventional EPROM shown in FIG. 1 is charged.

The bit selecting transistor 4 and the cell-transistor 1 are respectively connected between the bus line 6 and the bit line 3 and between the bit line 3 and the word line 2 in the same manner as those shown in FIG. 1. The bit line selecting signal Y is supplied to the gate of the bit selecting transistor 4 and the word line selecting signal X is supplied to the cell-transistor 1.

In the reading mode, data is read out from the cell-transistor 1 as follows.

When the state of the EPROM changes from the stand-by state to the active state, the ATD signal supplied to the transistor 16 is activated (a high level) for a predetermined time. When the ATD signal is activated, the transistor 16 is turned on. As a result, a current flows from the power line to the ground line through the transistor 16, the bus line and the diodes 18 and 19. In this state, each of diodes 18 and 19 generates a forward voltage of 0.6 [V]. Thus, the voltage level of the bus line 6 is maintained at the total sum (1.2 [V]) of the forward voltages generated by the diodes 18 and 19. As the diodes 18 and 19 rapidly generate the forward voltages by supply of the forward current, the bus line 6 is rapidly charged to a predetermined voltage level (e.g. 1.2 [V]).

After the bus line 6 is charged to the predetermined voltage level, the ATD signal becomes inactive (a low level). Then, a cell-transistor 1 identified by the address signal is selected. When data "1" is stored in the selected cell-transistor 1, a current flows through the transistor 13, the bus line 6, the bit selecting transistor 4 and the selected cell-transistor 1. As a result, the output voltage Vout having the low level corresponding to the data "1" is output from the output terminal 14. On the other hand, when data "0" is stored in the selected cell-transistor 1, no current flows through the transistor 13. Thus, the output voltage Vout having the high level corresponding to the data "0" is not changed and is output from the output terminal 14.

When the data "1" is read out from the cell-transistor 1, the current flows through the cell-transistor 1 and the voltage level of the bus line 6 decreases. In this state, when the address signal is switched and the ATD signal is activated, the transistor 16 is turned on and the bus line 6 is rapidly charged to the predetermined voltage level (e.g. 1.2 [V]) due to the forward voltages of the diodes 18 and 19.

Figure 5:
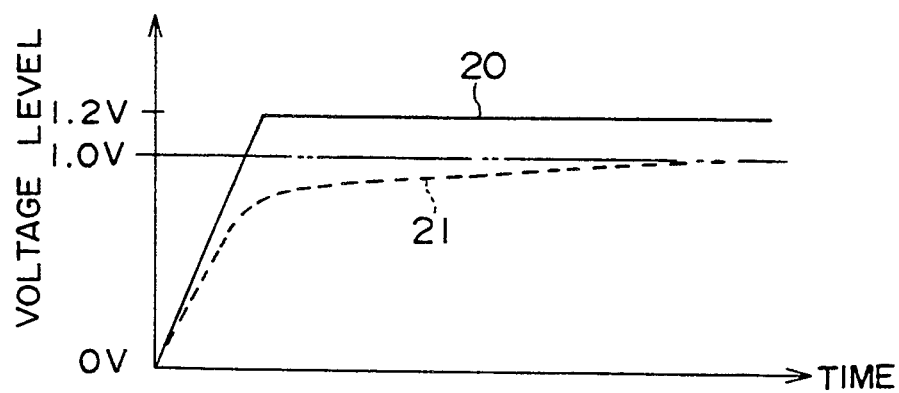
FIG. 5 is a graph illustrating a characteristic by which a bus line in the EPROM shown in FIG. 4 is charged.

According to the first embodiment described above, in the read mode, the bus line 6 is rapidly charged to the predetermined voltage level (e.g. 1.2 [V]) due to the forward voltages of the diodes 18 and 19, as shown by the solid line 20 in FIG. 5, every time the ATD signal is activated. Thus, the high-speed operation of the EPROM can be performed.

In FIG. 5 the dotted line 21 indicates the characteristic by which the bus line 6 is charged in the conventional EPROM shown in FIG. 1.

A description will now be given, with reference to FIGS. 6 and 7, of a second embodiment of the present invention.

Figure 6:
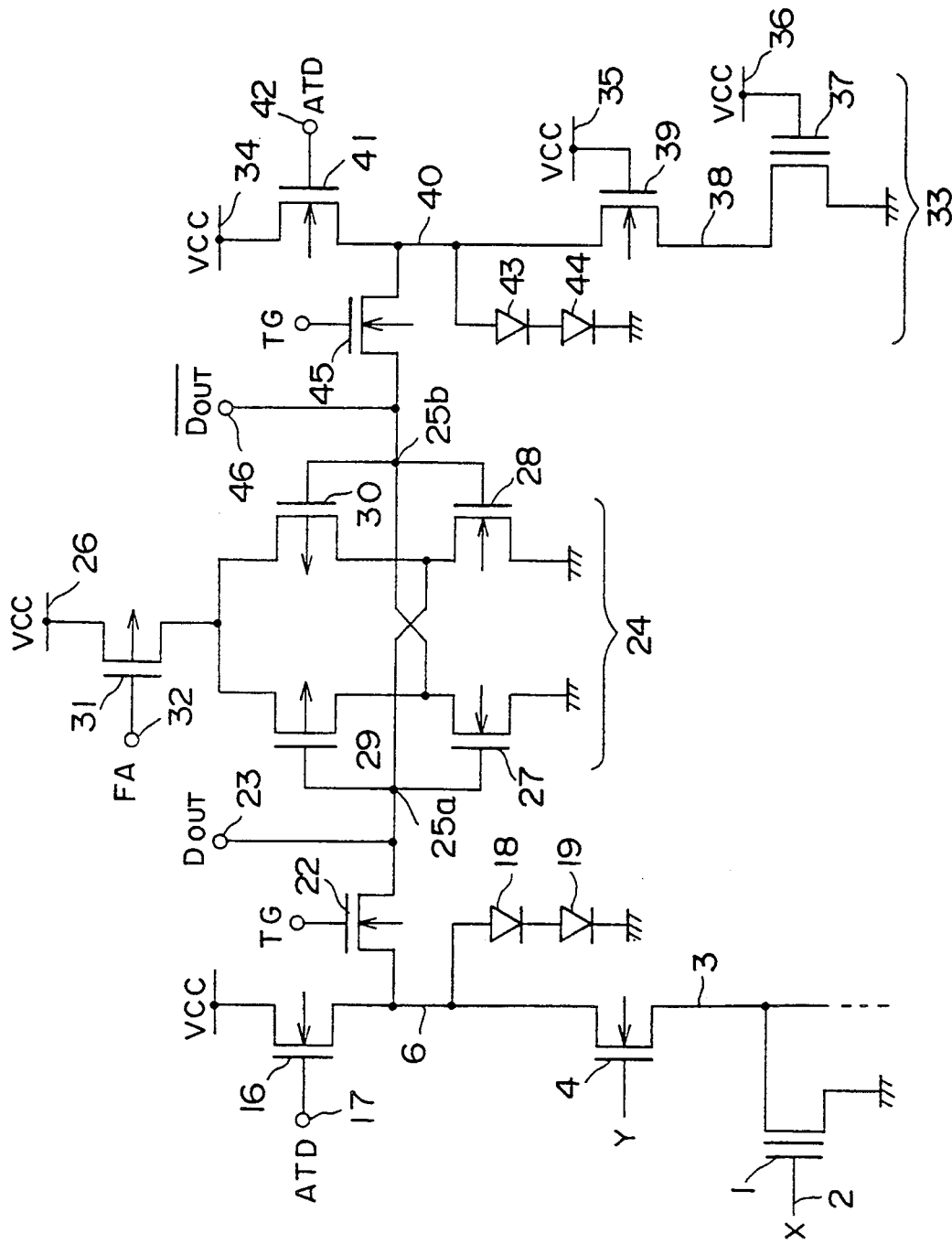
FIG. 6 is a circuit diagram illustrating an essential part of the EPROM according to a second embodiment of the present invention.

An essential part of an EPROM according to the second embodiment of the present invention is shown in FIG. 6. In FIG. 6, those parts which are the same as those shown in FIGS. 1 and 4 are given the same reference numbers.

The circuit shown in FIG. 6 is not provided with the load transistor 13 as shown in FIG. 4. Referring to FIG. 6, the transistor 16 to which the ATD signal is supplied is connected between the power line (Vcc) and the bus line 6, and the diodes 18 and 19 are connected between the bus line 6 and the ground line in the same manner as those shown in FIG. 4. The bit selecting transistor 4 and the cell-transistor 1 are respectively connected between the bus line 6 and the bit line 3 and between the bit line 3 and the word line 2.

The bus line 6 is connected to an output terminal 23 via a transfer gate transistor 22 (an n-MOS transistor) and connected to a first terminal 25a of a flip-flop circuit 24. A transfer gate control signal TG is supplied to the gate of the transfer gate transistor 22. The flip-flop circuit 24 is formed of driving transistors 27 and 28 (n-MOS transistors), load transistors 29 and 30 (p-MOS transistors), and a control transistor 31 (n-MOS transistor). The drain and the gate of the control transistor 31 are respectively connected to the power line (Vcc) and a control terminal 32. The source of the control transistor 31 is connected to the drains of both the load transistors 29 and 30. An activate signal FA for the flip-flop circuit 24 is supplied from an external system to the control terminal 32.

The circuit shown in FIG. 6 is provided with a reference circuit 33. The reference circuit 33 has almost the same structure as the circuit formed of the transistor 16, the bus line 6, the diodes 18 and 19, the bit selecting transistor 4 and the cell-transistor 1. That is, the reference circuit 33 has a cell-transistor 37, a bit line 38, a bit selecting transistor 39, a bus line 40, a transistor 41 and diodes 43 and 44. The cell transistor 37 and the bit selecting transistor 39 are respectively connected to power lines 36 and 35 so that these transistors 37 and 39 are always in a selected state. The transistor 41 is connected between a power line 34 and the bus line 40. The gate of the transistor 41 is connected to a terminal to which the ATD signal is supplied. The bus line 40 is connected to an output terminal 46 via a transfer gate transistor 45 to which the transfer gate control signal TG is supplied. There is an inverse relationship between the output signal Dout from the output terminal 23 and the output signal Dout from the output terminal 46. The flip-flop circuit 24 and the reference circuit 33 are provided, for example, in the sense amplifier 105 shown in FIG. 3.

Figure 7:
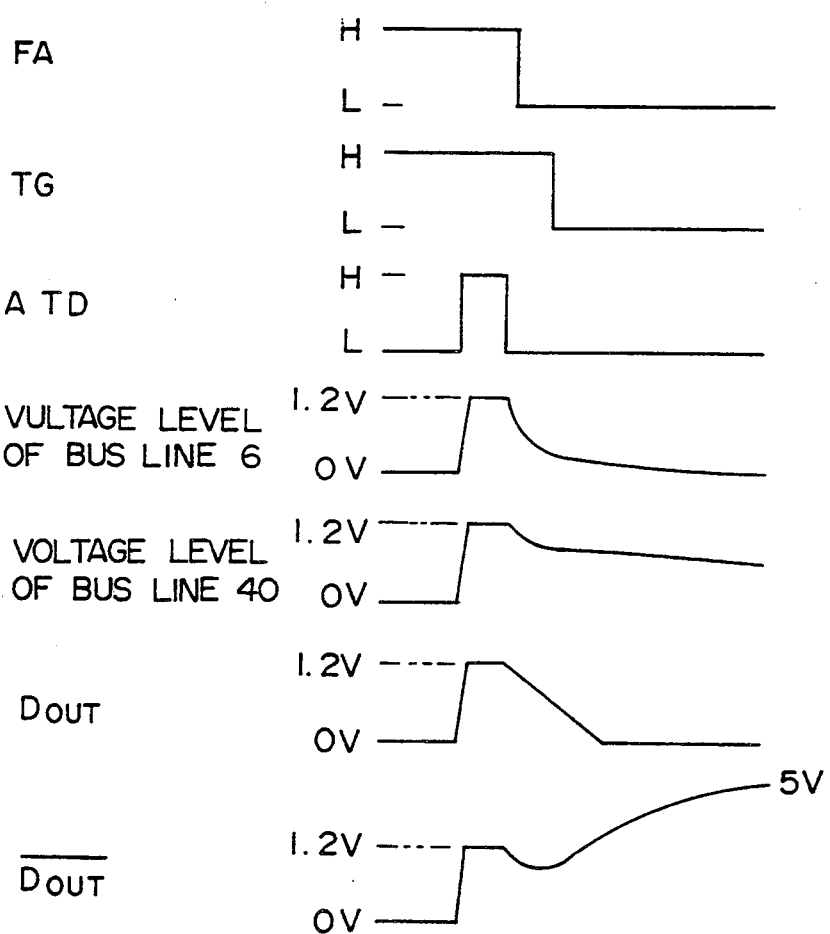
FIG. 7 is a wave form chart illustrating various signals generated in the circuit shown in FIG. 6.

In the read mode, when the current flows through the cell-transistor 1 (the data "1" is stored), the flip-flop activate signal FA, the transfer gate control signal TG, the ATD signal, the voltage of the bus line 6, the voltage of the bus line 40 and the output signals Dout and $\overline{\text{Dout}}$ vary as shown in FIG. 7.

According to the second embodiment described above, the bus line 6 can be rapidly charged to the predetermined voltage (e.g. 1.2 [V]) due to the forward voltages of the diodes 18 and 19, in the same manner as in the first embodiment shown in FIG. 4.

Figure 8:
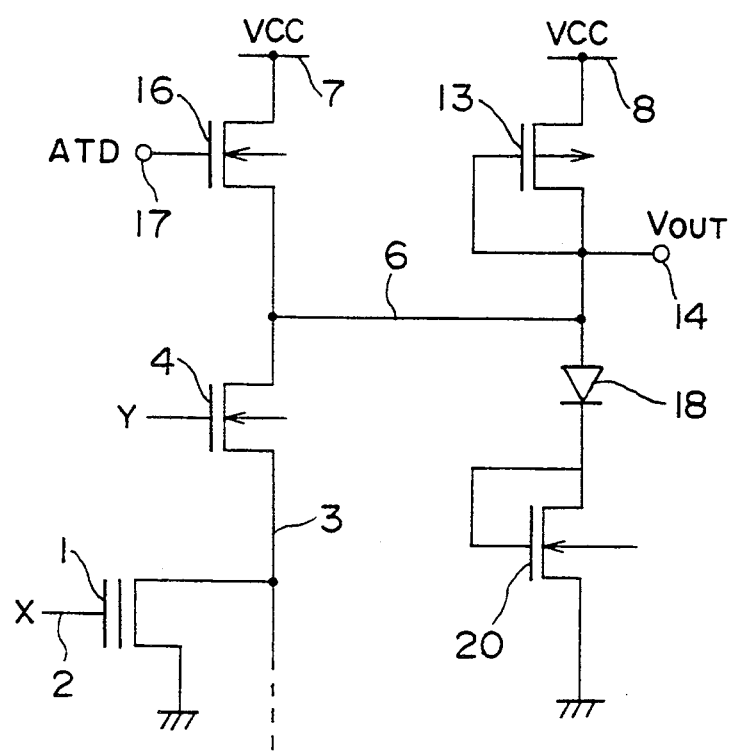
FIG. 8 is a circuit diagram illustrating an essential part of the EPROM according to a third embodiment of the present invention.

A description will now be given, with reference to FIG. 8, to a third embodiment of the present invention. In FIG. 8, those parts which are the same as those shown in FIGS. 4 and 6 are given the same reference numbers.

Referring to FIG. 8, a transistor 20 (an n-MOS transistor) is substituted for the diode 19 shown in FIGS. 4 and 6. That is, both the drain and the gate of the transistor 20 are connected to the diode 18, and the source of the transistor 20 is connected to the ground line. In this third embodiment, when the transistor 16 is turned on, the current flows from the power line 7 to the ground line through the transistor 16, the bus line 6, the diode 18 and the transistor 20. In this case, the diode 18 generates the forward voltage of 0.6 V and a voltage $V_{th}$ is generated between the drain and the source of the transistor 20. Thus, the voltage level of the bus line 6 is maintained at the sum of the forward voltage of the diode 18 and the voltage $V_{th}$ of the transistor 20. When a transistor 20 generating a $v_{th}$ of 0.4 [V] is connected between the diode 18 and the ground line, the bus line 6 can be charged to 1.0 [V] (=0.6v+0.4v).

According to the third embodiment described above, as the current rapidly flows through the diode 18 and the transistor 20, the bus line 6 can be rapidly charged to the predetermined voltage level (e.g. 1.0 [V]). In addition, the voltage $V_{th}$ of the transistor 20 depends very much on electrical properties thereof. Thus, by changing the transistor 20 to another one having other electrical properties, the voltage level to which the bus line 6 is charged can be controlled.

When the current flows through the diode, the diode generates a precise forward voltage (e.g. 0.6 [V]). Thus, it is preferable that the bus line 6 be charged using only the forward voltages of the diodes as shown in FIGS. 4 and 6.

A single transistor generating the voltage $V_{th}$ of about 1.0 [V] can be also provided between the bus line 6 and the ground line.

In the above embodiments, the present invention is applied to an EPROM- Furthermore, the present invention may be applied to an EEPROM and a flash memory.

The present invention is not limited to the aforementioned embodiments, and variations and modifications may be made without departing from the scope of the claimed invention.

What is claimed is:

1. A non-volatile semiconductor memory device, comprising:
   a bus line;
   a plurality of bit lines coupled to said bus line;
   a cell transistor, connected between each of said bit lines and a word line, for storing electrical information;
   an output circuit, coupled to said bus line, for outputting a signal corresponding to the electrical information stored in said cell transistor when said bus line has been charged to a predetermined voltage level;
   a constant voltage circuit coupled to said bus line, the constant voltage circuit generating a voltage having an approximately constant level when a current flows through said constant voltage circuit; and
   a current supply circuit, coupled to said bus line, for supplying a current to said constant voltage circuit via said bus line in accordance with a control signal supplied from an external unit, wherein
   said bus line is charged to a predetermined voltage level by the voltage generated by said constant voltage circuit, said current supply circuit being connected so as to receive the external control signal such that the external control signal controls said current supplied by said supply circuit and wherein said external control signal is a signal corresponding to an address transition detector signal.

2. A non-volatile semiconductor memory device as claimed in claim 1, wherein said current supply circuit comprises a voltage line maintained at a predetermined voltage level, and a switching circuit provided between said voltage line and said bus line, said switching circuit being turned on and off in accordance with the control signal, and wherein a current is supplied from said voltage line to said constant voltage circuit via said switching circuit and said bus line when said switching circuit is turned on.

3. A non-volatile semiconductor memory device as claimed in claim 1, wherein said constant voltage circuit comprises a plurality of elements connected in series between said bus line and a predetermined line so that a current flows from said bus line to said predetermined line through said plurality of elements, each of said plurality of elements generating a voltage having an approximately constant level, whereby a voltage having a constant level corresponding to a sum of voltages generated by said plurality of elements is applied across said bus line and said predetermined line.

4. A non-volatile semiconductor memory device as claimed in claim 3, wherein said plurality of elements includes a diode.

5. A non-volatile semiconductor memory device as claimed in claim 3, wherein said plurality of elements includes a transistor.

6. A non-volatile semiconductor memory device as claimed in claim 1, wherein said constant voltage circuit comprises two diodes connected in series between said bus line and a predetermined line so that a current flows from said bus line to said predetermined line through said two diodes.

7. A non-volatile semiconductor memory device as claimed in claim 1, wherein said constant voltage circuit comprises a diode and a transistor connected in series between said bus line and a predetermined line so that a current flows from said bus line to said predetermined line through said diode and said transistor.

8. A non-volatile semiconductor memory device as claimed in claim 7, wherein a voltage level generated by said diode is greater than a voltage level generated by said transistor.

9. A non-volatile semiconductor memory device, comprising:
   a bus line;
   a plurality of bit lines coupled to said bus line;
   a plurality of cell transistors, each connected between a corresponding one of said plurality of bit lines and a word line, for storing electrical information;
   an output circuit, coupled to said bus line, for outputting a signal corresponding to the electrical information stored in said plurality of cell transistors when said bus line has been charged to a predetermined voltage level;
   a constant voltage circuit coupled to said bus line, generating the predetermined voltage level for said bus line, the predetermined voltage level being substantially constant;
   control means for controlling storing and reading of the electrical information in said plurality of cell transistors; and
   a current supply circuit coupled to said bus line and to said control means, for supplying a current to said constant voltage circuit via said bus line, wherein
   said bus line is charged to the predetermined voltage level by said constant voltage circuit, said control means being connected to said current supply circuit so as to control said current supply circuit thereby controlling said constant voltage circuit and wherein said current supply circuit supplies the current to the constant voltage circuit in accordance with a signal corresponding to an address transition detector signal from said control means.

10. A non-volatile semiconductor memory device as claimed in claim 9, wherein said current supply circuit comprises a voltage line maintained at a predetermined supply voltage level, and a switching circuit provided between said voltage line and said bus line, said switching circuit being turned on and off by said control means, and wherein a current is supplied from said voltage line to said constant voltage circuit via said switching circuit and said bus line when said switching circuit is turned on.

11. A non-volatile semiconductor memory device as claimed in claim 9, wherein said constant voltage circuit comprises a plurality of elements connected in series between said bus line and a predetermined line so that a current flows from said bus line to said predetermined line through said plurality of elements, each of said plurality of elements generating a voltage having an approximately constant level, whereby a voltage having a constant level corresponding to a sum of voltages generated by said plurality of elements is applied across said bus line and said predetermined line.

12. A non-volatile semiconductor memory device as claimed in claim 11, wherein said plurality of elements includes a diode.

13. A non-volatile semiconductor memory device as claimed in claim 11, wherein said plurality of elements includes a transistor.

14. A non-volatile semiconductor memory device as claimed in claim 9, wherein said constant voltage circuit comprises two diodes connected in series between said bus line and a predetermined line so that a current flows from said bus line to said predetermined line through said two diodes.

15. A non-volatile semiconductor memory device as claimed in claim 9, wherein said constant voltage circuit comprises a diode and a transistor connected in series between said bus line and a predetermined line so that a current flows from said bus line to said predetermined line through said diode and said transistor.

16. A non-volatile semiconductor memory device as claimed in claim 15, wherein a voltage level generated by said diode is greater than a voltage level generated by said transistor.

* * * * *